United States Patent [19]

Massa et al.

[11] 4,158,808

[45] Jun. 19, 1979

[54] LOAD SOURCE SIMULATOR

[75] Inventors: Richard L. Massa, Sterling Heights; Robert C. Murray, Troy; Kenneth J. Cook, Oak Park, all of Mich.

[73] Assignee: The Valeron Corporation, Oak Park, Mich.

[21] Appl. No.: 825,745

[22] Filed: Aug. 18, 1977

[51] Int. Cl.² .................... G01R 35/00; G05F 3/00
[52] U.S. Cl. ...................................... 324/74; 323/121
[58] Field of Search ............... 324/74, 130, 141, 142; 323/108, 109, 110, 121, 129; 328/155; 307/262

[56] References Cited

U.S. PATENT DOCUMENTS

| 1,587,841 | 6/1926 | Knopp | 324/74 |
| 2,769,928 | 11/1956 | Emker | 324/74 |

Primary Examiner—Palmer C. Demeo
Assistant Examiner—Ernest F. Karlsen
Attorney, Agent, or Firm—Krass & Young

[57] ABSTRACT

A high power source load simulator presents itself to a power meter as a conventional electrical load, but in fact is highly portable and dissipates relatively little power and heat. A current source generates a selectively variable current signal which is characterized by a relatively low, constant voltage. A voltage source generates a selectively variable voltage signal which is phase locked with the current signal and is characterized by a relatively low, constant current. The phase angle between the two signals is selectively variable by means of a phase shift network interposed mediate the voltage and current sources. The current and voltage signals are impressed upon the current and voltage sensing inputs of a power monitor via jumper cables. An AGC circuit is also interposed between the voltage and current sources to insure the amplitude independence of their respective signals.

19 Claims, 6 Drawing Figures

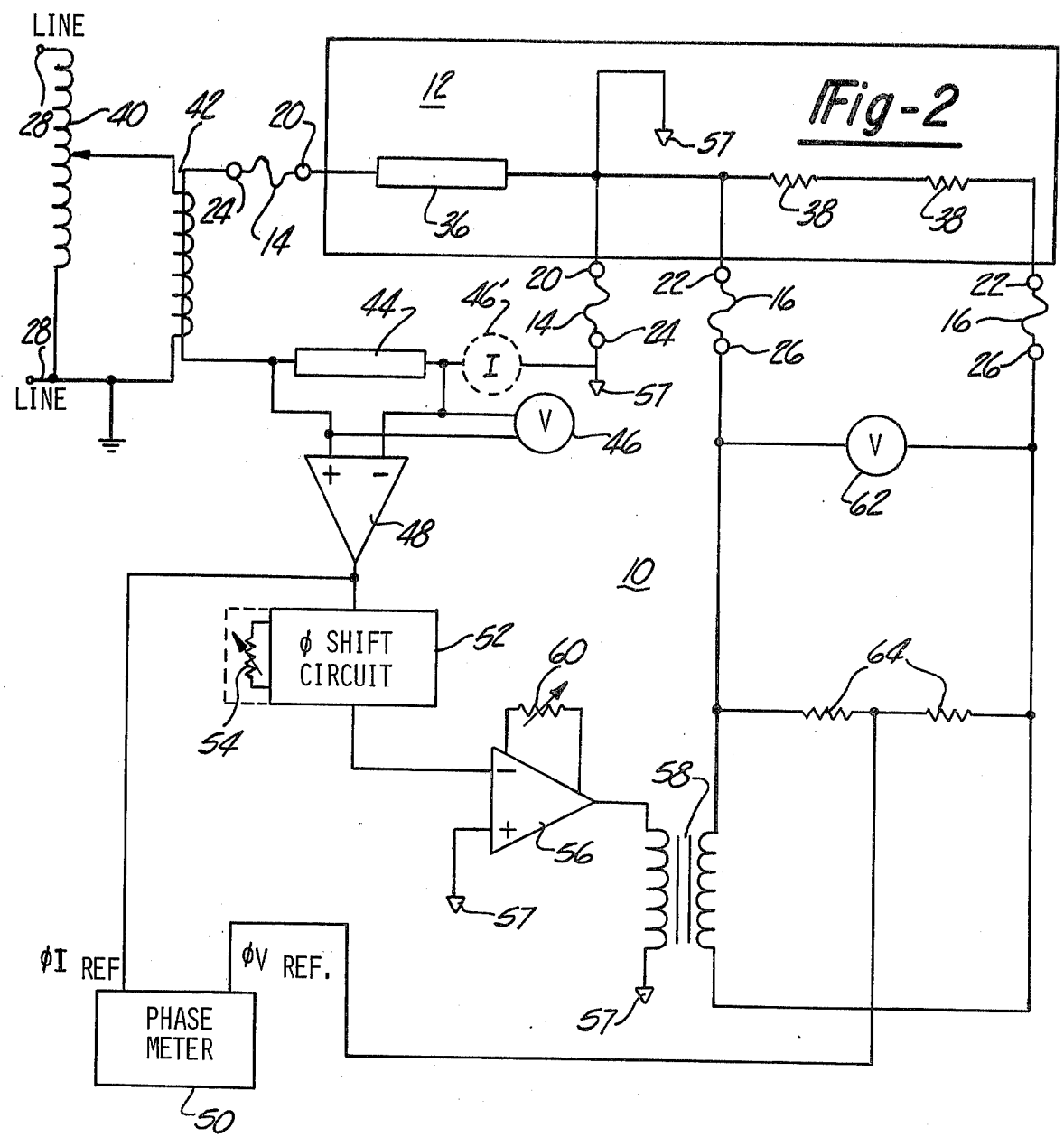
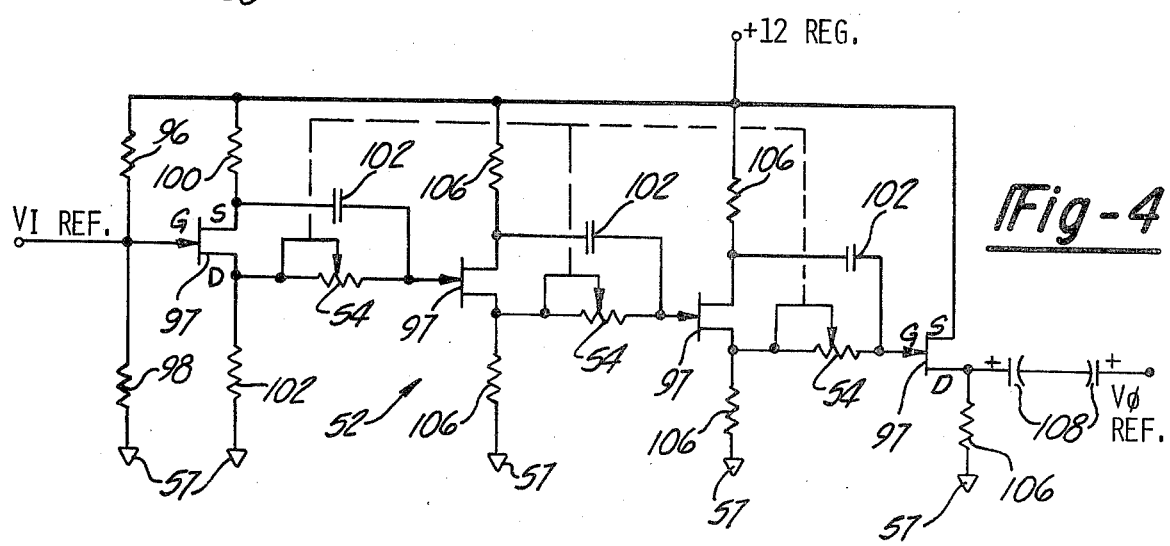

LOAD SOURCE SIMULATOR

INTRODUCTION

The present invention pertains to apparatus for the simulation of electrical loads and specifically to load simulators which employ independent voltage and current sources to minimize power dissipation during the testing and calibration of electrical power measuring devices.

BACKGROUND OF THE INVENTION

High-wattage power meters are frequently used in industry to monitor various operational parameters of large electrical devices such as motors, lathes, pumps and the like. Such meters must be tested and calibrated periodically to insure their accuracy, not only at the time of manufacture but after installation. Typical calibration procedures call for electrically interconnecting the device under test with an actual load capable of operating the meter to its full scale which can be as high as several hundred thousand watts. Such test loads are often prohibitively large and expensive. For example, many typical industrial buildings have 220 volts at 100 amps three-phase service. In order to calibrate a 200 horsepower meter (equivalent to 149,200 watts) at full scale, more than 60 percent of the buildings total electrical service capacity would be required. Furthermore, this amount of power being dissipated by an actual load within such a building, would require 4.2 refrigeration tons of cooling to nullify the heat dissipated by the load.

An alternative calibration procedure, which is employed for larger power meters, requires the electrical interconnection of the meter under test with an actual source and load through calibrated reference shunts, current transformers, voltage transformers and the like. Although simulating a large load, such an arrangement still necessitates the dissipation of large amounts of power in the actual load. Additionally, the phase angle between the load voltage and current is not selectively variable. Finally, the tolerances of the shunts and transformers are compounded, thereby limiting the accuracy to which the meter may be calibrated.

BRIEF SUMMARY OF THE INVENTION

An object of the present invention is to provide a high power source-load simulator which appears to the device under test (DUT) to be a large conventional electrical load but in fact is presented by a small portable device which can be carried into a plant, and which, in use, does not generate large amounts of heat. In general, this is accomplished by a simulator having a selectively variable current source and an independent selectively variable voltage source. The current signal provides a phase reference and the voltage signal is phase locked therewith via an intermediate selectively variable phase shift network. Thus, the current and voltage sources are independent from one another with respect to amplitude and their relative phase shift is independently controlled by the phase shift circuit. Inasmuch as any electrical power measuring device is based on the equation:

$$P = EI \cos \theta$$

a load power can be simulated by the product of the voltage, current and the cosine of the phase angle between them (power factor). From the point of view of the DUT, the simulated load is indistinguishable from an actual load of the same effective magnitude. Because the voltage and current sources are separate and independent, it is not necessary to dissipate the effective power equivalence of the product of the two in order to calibrate the DUT.

The preferred embodiment of the invention comprises a shunt which is inserted electrically in series with the controlled current source, the voltage across the shunt being proportional to the current flowing through it. This voltage is amplified and fed through an Automatic Gain Control (AGC) circuit to insure the independence of the current and voltage sources. The output of the AGC circuit is fed through a conventional phase shift network, amplified and connected to the primary coil of a step-up power transformer. By regulating the amplifier gain, the voltage sensed by the voltage inputs of the DUT can be varied idenpendently of the current sensed by the current inputs of the DUT. This configuration of the invention dissipates very little power, is extremely accurate, is highly portable, has a continuously adjustable phase angle from 0° to 360°, faithfully simulates circuit conditions and can be manufactured at low cost.

Various other features and advantages of the invention will become apparent upon a reading of the following specification which, along with the patent drawings, describes and discloses a preferred illustrative embodiment of the invention in great detail.

BRIEF DESCRIPTION OF THE DRAWINGS

FIG. 2 is a block-schematic diagram of the preferred embodiment of the load simulator;

FIG. 4 is a schematic diagram of the phase shift network;

DETAILED DESCRIPTION OF A SPECIFIC EMBODIMENT

Figure 1:
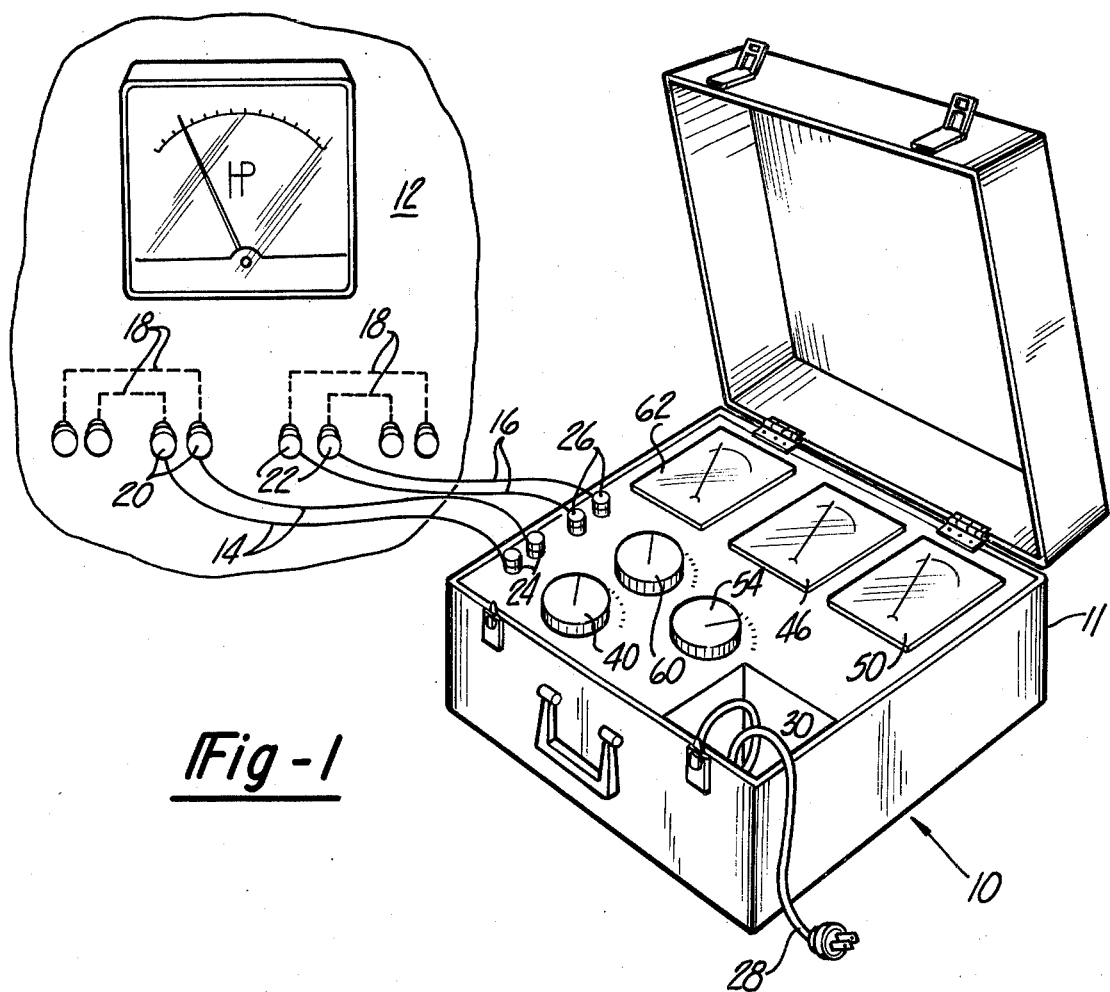
FIG. 1 is a perspective view of the preferred embodiment of the load simulator illustrating the interconnection of the simulator and a power meter.

FIG. 1 pictorially illustrates the preferred embodiment of the invention. A load simulator 10 is contained within a suitcase-like housing 11 to enhance its portability. In application, the simulator 10 is carried to the location of a power meter which is to be calibrated. A panel-mounted power meter or device under test (DUT) is illustrated. However, it is contemplated that any power meter having separate voltage and current sensing inputs could be substituted. The DUT 12 has a pair of current sensing input terminals 20 and a pair of voltage sensing input terminals 22 which, during normal operation, would be electrically interconnected with the circuit being monitored via jumpers 18 (illustrated in phantom). During the testing or calibration, the jumpers 18 are removed, thereby isolating the DUT 12 from any external circuitry which may produce a false reading during the calibration procedure.

Once in the proximity of a DUT 12, the load simulator 10 need only be electrically interconnected therewith. The load simulator 10 has a pair of current signal output terminals 24 and a pair of current jumper cables 14 electrically interconnect the simulator current signal output terminals 24 and the DUT current input terminals 20. Likewise, a pair of voltage jumper cables 16 electrically interconnect the simulator voltage signal output terminals 26 and the DUT voltage input terminals 22. The only other electrical connection that need be made is to plug a line cord 28 into a local source of 110 VAC line voltage.

The load simulator 10 is equipped with an independent current source and voltage source. The current source is selectively varied by an autotransformer 40 and the voltage source is selectively varied by an adjustable feed back gain resistor 60. A phase shift circuit, the details of which will be described below, electrically interconnects the voltage and current sources. The voltage source is phase locked with the current source through the phase shift circuit which is selectively variable via a phase control resistor 54. Within the load simulator, the output current signal from the current source is electrically impressed on terminals 24. The output current signal is characterized by a low voltage. When autotransformer 40 is varied, the output current signal at terminals 24 varies in magnitude. Likewise, the voltage source impresses an output voltage signal on terminals 26, said signal being characterized by a low current. As feedback gain resistor 60 is varied, the magnitude of the voltage output signal at terminal 26 varies in magnitude. Analog displays 62, 46 and 50 are provided to monitor the output voltage and the current signals from the simulator 10 as well as the phase angle between them, respectively. Although analog-type meters are illustrated, it is contemplated that any form of sensible readout such as digital meters could be substituted.

Thus, when a DUT 12 is to be calibrated, an operator need merely "dial" the desired current and voltage magnitudes as well as the phase angle between them in accordance with the well-known equation for power. Thereby, the load simulator 10 can simulate any form of electrical load without the dissipation of an appreciable amount of electrical power. When calibration is complete, the jumper cables 14 and 16 as well as the line cord 28 are merely disconnected from their associated terminals and placed in a storage area 3 within the simulator housing 11.

Referring to FIG. 2, the schematic block diagram illustrates the preferred embodiment of the load simulator 10 and its electrical interconnection with a DUT 12. The DUT 12 is of the type having a pair of current sensing input terminals 20 and a pair of voltage sensing input terminals 22. The current sensing input terminals 20 are internally bridged by a shunt 36 and the voltage sensing input terminals 22 are bridged by a voltage divider network 38. The shunt 36 and voltage divider network 38 are located internally of the DUT and are included for example only. It is contemplated that any type of power meter having separate voltage and current sensing inputs can be substituted.

The load simulator 10 has a pair of current signal output terminals 24 and a pair of voltage signal output terminals 26. In application, current jumper cables 14 interconnect the simulator current output terminals 24 with the DUT current input terminals 20 and a pair of voltage jumper cables 16 electrically interconnect the simulator voltage output terminals 26 and the DUT voltage input terminals 22.

Within the load simulator 10, the current source comprises an autotransformer 40 and a current step-up transformer 42. Line voltage is applied across the coil of autotransformer 40 through line cord 28. The autotransformer 40 may be of the type manufactured by Superior Power Company, Model 3PN126 having a variable output voltage range of zero to 110 VAC. However, it is contemplated that other equivalent devices can be substituted. The fixed output terminal of the autotransformer 40 is electrically connected to earth ground as well as to one of the primary coil terminals of current step-up transformer 42. The tap output terminal of autotransformer 40 is electrically connected to the other end of the primary coil of transformer 42. The current transformer 42 has a primary to secondary windings ratio of 1:40 and is of the type manufactured by Osborne, Model 70399 or 71301. Again, it is contemplated that other suitable equivalent devices may be substituted. The secondary windings of the current transformer 42 are connected to the current signal output terminals 24. A shunt 44 is connected in series with the secondary winding of the current transformer 42 for reasons which will be described below. The current signal output terminal associated with the shunt 44 is electrically connected to a tie-point 57. As the autotransformer is varied, the current flowing through the secondary windings of current transformer 42 and into the current sensing input terminals 20 of the DUT will be selectively variable and at a relatively low voltage.

The shunt 44 is a precision high amperage resistor through which current flows to the sensing inputs of the DUT. Although of slightly greater resistance than conventional shunts, the shunt 44 employs standard technology which would be known to one skilled in the art in light of any given set of design parameters. The shunt 44 is of the type manufactured by Ram Meter, Inc., type MSA-XXX. However, it is contemplated that other shunts could be substituted in its place. The voltage drop across the shunt is proportional to the current flowing through it. That voltage is fed into and amplified by a voltage amplifier 48 which includes an AGC circuit. The output of voltage amplifier 48 is fed into the phase current reference input of a phase meter 50 which is of the type manufactured by Wiltron, Model 351. However, it is contemplated that other equivalent units could be substituted. The output of amplifier 48 is also fed to a phase shift circuit 52, the output phase of which is selectively variable with respect to the input. The phase angle differential between the input and output of phase shift circuit 52, is determined by a variable phase control resistor 54. The output of phase shift circuit 52 is electrically fed to the negative input of a power amplifier 56. The positive input of power amplifier 56 is electrically connected to the tie-point 57. The output of power amplifier 56 is electrically connected to the primary coil of a step-up transformer 58. The other terminal of the primary coil of a step-up transformer 58 is connected to the tie-point 57. The gain of amplifier 56 is controlled by a selectively variable feedback gain control resistor 60. Thus, the controlled current source, phase shift circuit 52 and the controlled voltage source are each independently selectively variable.

The secondary windings of the step-up transformer 58 are electrically connected to a pair of voltage signal output terminals 26. Thus, as the feedback gain control resistor 60 is selectively varied, the voltage across voltage output signal terminals 26 will vary in magnitude. In application therefor, what the DUT will see will be a substantially ideal current source across current sensing inputs 20 and a phase independent ideal voltage source across the voltage input terminals 22. From the DUT's point of view, it is measuring the effective product of the current flowing through the current sensing terminals 20, the voltage across the voltage sensing terminals 22 and the phase angle between the two. The fact that the current source and the voltage source are independently variable is of no effect in the measuring mechanism. Accordingly, any high power source load (resistive, capacitive, inductive or a combination thereof) can be simulated by the present invention by independently adjusting the current flowing through the current sensing input of the DUT or the voltage across the voltage sensing inputs of the DUT and the phase angle between the two. This is the basic equation for deriving power as disclosed hereinabove.

The voltage source output is monitored by electrically connecting an RMS volt meter 62 across the voltage output terminals 26. The current source output can be measured by electrically interconnecting an RMS ammeter 46' in series with the secondary windings of current transformer 42. An alternative method for monitoring the current source would be to electrically connect an RMS volt meter 46 across the shunt 44 to measure its associated voltage drop. The volt meter method is preferred for reasons of economy and improved accuracy. A voltage divider network 64 is placed across the secondary windings of transformer 58. The divider tap electrically feeds the phase voltage reference input of the phase meter 50. The reference voltage divider 54 is merely to scale the high voltage circuit to within the operational parameters of the phase meter 50. As described above, in a typical test situation, any desired load power can be simulated by adjusting the autotransformer 40, the feedback gain resistor 60 of the power amplifier 56 and the phase adjusting resistor 54 of the phase shift circuit 52.

Figure 3:
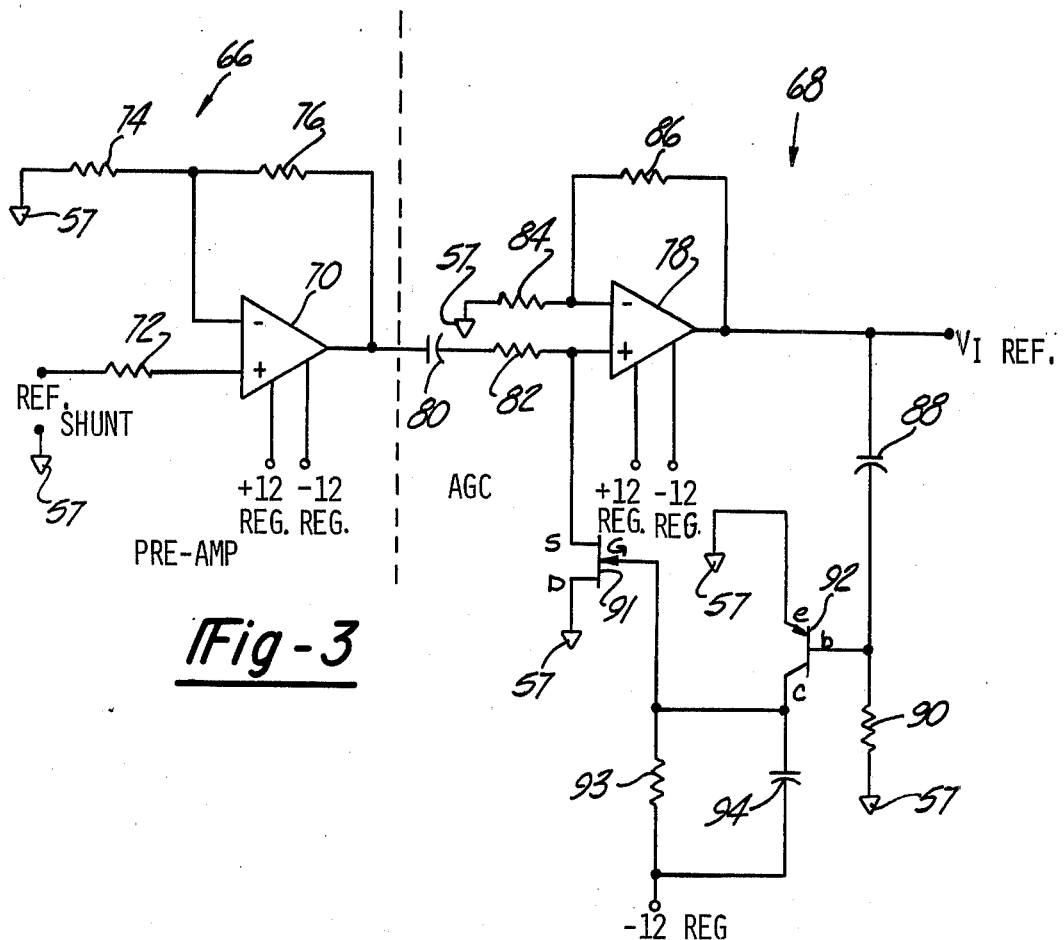
FIG. 3 is a schematic diagram of the pre-amp and AGC networks.

Referring to FIG. 3, the schematic diagram of the voltage amplifier 48 is illustrated. The voltage amplifier 48 consists of a pre-amp section 66 and an AGC circuit 68. The pre-amp 66 is made of a first one-fourth section 70 of a quad operational amplifier (OP AMP) such as that manufactured by National Semiconductor, Model LM324N. The voltage signal developed across the reference shunt is fed into the positive terminal of OP AMP section 70 through a 1 K current limiting series resistor 72. For the purposes of this specification, all resistor values are given in ohms. The negative input of OP AMP section 70 is electrically interconnected to a tie-point 57 through another 1 K current limiting resistor 74. The output of OP AMP section 70 is interconnected with the negative input by a 75 K feedback gain resistor 76. The ratio of resistors 76 and 74 determine the gain of the pre-amp section 66. OP AMP section 70 is energized by plus and minus 12 volt regulated power supplies which will be described in detail below.

The AGC section 68 is of conventional design which maintains its output level (the current reference voltage) constant at a preset limit even when the controlled current source is varied. This prevents the high voltage source from being affected by changes in the high current source. The output of OP AMP section 70 is electrically interconnected with the positive input of a second section 78 of the quad OP AMP through a series combination of a 0.1 mf coupling capacitor 80 and a 340 K current limiting resistor 82. The coupling capacitor 80 eliminates any DC offsets. The negative input to OP AMP section 78 is connected to the tie-point 57 through a 1 K current limiting resistor 84. The output of OP AMP section 78 and its negative input are interconnected by a 68 K feedback resistor 86 which, with resistor 84, determines the gain of the OP AMP. The output of OP AMP section 78 is also connected to the tie-point 57 through a series combination of a 0.47 mf capacitor 88 and a 10 K resistor 90. Capacitor 88 and resistor 90 form an RC filter, the common connection of which is fed to the base of a transistor 92 such as the type manufactured by Motorola, Model 2N4403. The emitter of transistor 92 is connected to the tie-point 57. The collector of transistor 92 is connected to the gate of a field effect transistor (FET) 91 such as that manufactured by Motorola, Model 2N5638. The collector of transistor 92 is also electrically interconnected to a negative 12 volt regulated power supply that will be described in detail below through a parallel combination of a 1 M reference resistor 93 and a 10 mf bypass capacitor 94 which is included to prevent degenerative feedback. The drain of FET 91 is connected to the tie-point 57 and the source is connected to the positive input of OP AMP section 78.

When, for example, the controlled current source setting is increased, the output of amplifier section 70 tends to increase. So too will the output of amplifier section 78. The RC filter will cause the base of transistor 92 to see a substantially DC level. As the output of OP AMP section 78 increases, the base voltage of transistor 92 will also increase. This will tend to shut off the transistor 92 and increase the gate voltage of FET 91 by increasing the effective controller to emitter voltage drop across transistor 92. As the gate voltage of FET 91 increases, the source to drain resistance decreases, thereby drawing more current from the output of preamp 66. Accordingly, the positive input of OP AMP section 78 will be reduced as will its output. This stabilizing effect will result in a current reference voltage output of OP AMP section 78 which is substantially constant.

Referring to FIG. 4, a conventional three-section phase shift network is illustrated generally at 52. Each section theoretically allows up to 180 degree phase shift capability or a total of 540 degrees total phase shift with respect to the input voltage which is the current reference voltage output from the AGC circuit 68. The third section will compensate for any inability of either of the first two sections to achieve a full 180 degree phase shift and insures a total 360 degree phase shift capability. It is contemplated that fewer sections can be employed depending upon the application. The operation of these phase shift networks are so well known in the art as not to require a detailed explanation here. The current reference voltage input is fed to the gate of a field effect transistor (FET) 97 such as that manufactured by Motorola, Model MPF102. A gate reference voltage is maintained by a voltage divider network composed of a 6.8 M resistor 96 interconnected between the gate of FET 97 and a +12 volt regulated power supply and a 1 M resistor 98 interconnecting the gate of FET 97 and the tie-point 57. The source of FET 97 is also connected to the +12 volt regulated power supply through a 2.2 K resistor 100. The drain is electrically interconnected to the tie-point 57 through a 2.2 K resistor 102. The drain of FET 97 is connected to the gate of the next succeeding FET 97 through the fixed taps of variable phase control 1 M resistor 54. The wiper of resistor 54 is also connected to the drain of FET 97. Resistor 54 has three gangs, one for each stage of the phase shifter network 52. The source of FET 97 is also electrically interconnected to the gate of the next succeeding FET through a 0.01 mf capacitor 102. The ratio of resistor 54 and capacitor 102 determines the amount of phase shift per section, which can be up to 180 degrees depending upon the setting of the wiper of variable resistor 54. The sources and drains of the succeeding FETs 97 and connected to the +12 volt regulated power supply and to the tie-point 57 respectively through 4.7 K biasing resistors 106. The source of the last FET 97 is directly connected to the +12 volt regulated power supply. The drain of the last FET 97 is thus the output of the next succeeding stage through two 10 mf coupling capacitors 108 which are arranged in a non-polarized series combination. The phase reference voltage output of phase shifting network 52 will thus be substantially identical to the current reference voltage input except phase shifted from zero degrees to 540 degrees depending upon the setting of the variable resistors 54.

Figure 5:
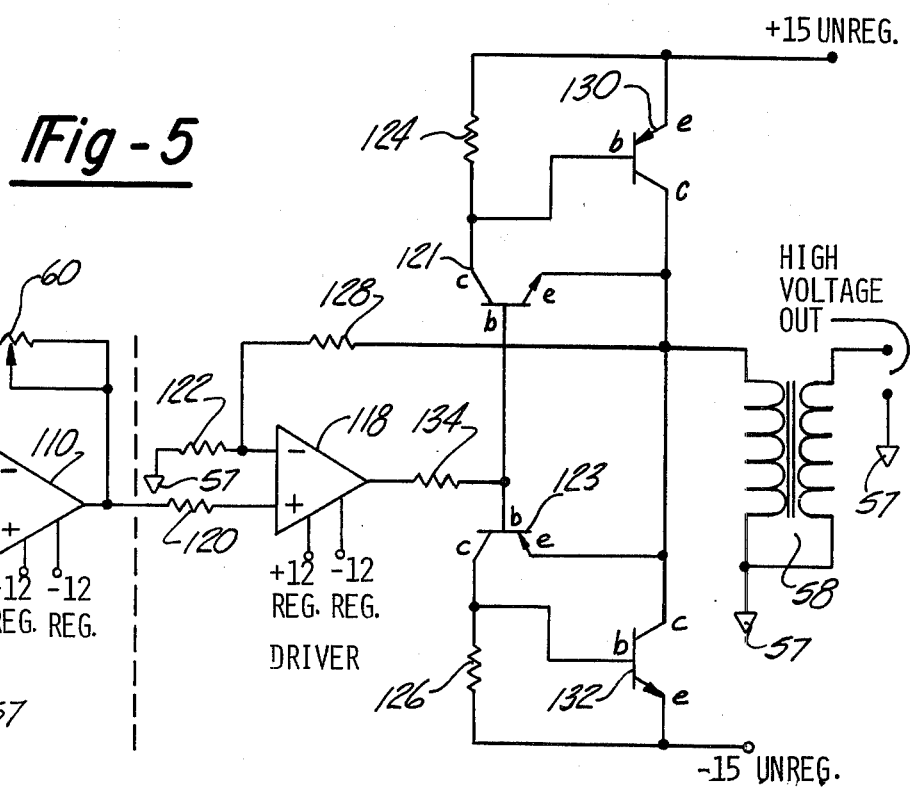
FIG. 5 is a schematic diagram of the phase amplifier, driver and power amplifier networks.

Referring to FIG. 5, the schematic diagram of the controlled voltage source is illustrated. The controlled voltage source comprises amplifier 56, variable resistor 60 and transformer 58. The phase reference voltage from the phase shift circuit 52 is received by the negative input of the third OP AMP section 110 of the quad OP AMP through a 10 K current limiting resistor 112. The positive input of amplifier 110 is fed to the tie-point 57 through a 10 K compensating resistor 114. The output of OP AMP section 110 is interconnected to its negative input through a 500 K variable resistor 60, the wiper of the resistor being connected to the output of OP AMP section 110. The ratio of resistor 112 and feedback resistor 60 determine the the gain of OP AMP section 110. The output of OP AMP section 110 is also electrically interconnected to the positive input of a fourth OP AMP section 118 of the quad OP AMP through a 1 K current limiting resistor 120. The OP AMP section 110 and its associated passive elements comprise a phase amplifier well known to those skilled in the art. OP AMP section 118 and its associated passive elements comprise a driver for the subsequent power amplifier. The negative input of OP AMP section 118 is connected to the tie-point 57 through a 1 K current limiting resistor 122. The output of OP AMP section 118 is connected to the bases of two transistors 121 and 123 of the type manufactured by Motorola, Model MJE182 and MJE172, respectively. The collectors of transistors 121 and 123 are interconnected to +15 and −15 volt unregulated power supplies respectively through 150 ohm reference resistors 124 and 126, respectively. The emitters of transistors 121 and 123 are both electrically connected to the negative input of amplifier section 118 through a 9.1 K resistor 128. The collector of transistor 121 is electrically connected to the base of a power transistor 130 and the collector of transistor 123 is connected to the base of a second power transistor 132. Transistors 130 and 132 are of the type manufactured by Motorola, Model 2N2955. The emitters of transistors 130 and 132 are electrically connected to the +15 and −15 volt unregulated power supplies respectively. The collectors of transistors 130 and 132 are electrically connected to the emitters of transistors 121 and 123, respectively. The output of amplifier section 118 is electrically interconnected to the bases of transistors 121 and 123 through a 680 ohm resistor 134. The output wave form of amplifier section 118 is substantially a sine wave, the phase of which has been shifter from that of the current reference voltage by the phase shifting circuit 52. During positive half-cycles, transistor 121 is relatively conductive and transistor 123 is relatively non-conductive. When transistor 121 becomes conductive, its collector current increases and turns on transistor 130. When transistor 130 is on, the +15 volt unregulated power supply feeds the primary coil of a power transformer 58. During the negative half-cycle, the transistor 123 is on and transistor 121 is off. Thus, transistor 132 will be conductive and the −15 volt unregulated power supply will feed the primary coil of transformer 58. Transformer 58 has a primary and secondary turns ratio of 1:91 and is of the type manufactured by Osborne, Model 70393. One terminal of both primary and secondary windings of transformer 58 is connected to the tie-point 57 while the remaining terminal of the secondary winding is connected to the high voltage circuit as described in FIGS. 1 and 2.

Figure 6:
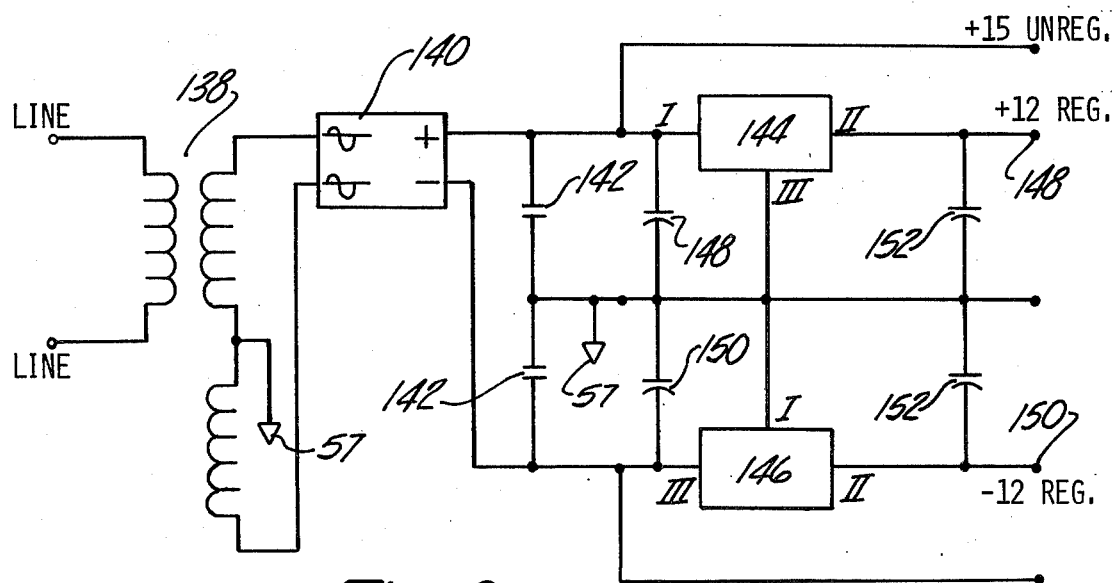
FIG. 6 is a schematic diagram of the power supply circuit.

Referring to FIG. 6, the power supply is illustrated. The primary coil of a power transformer 138 such as that manufactured by Stancor, Model P-8663 is connected to 110 VAC line voltage. The transformer 138 has a 24 VAC output from the secondary coil with a center tap. The center tap is connected to the tie-point 57. The terminals of the secondary coil of transformer 138 are connected to the AC input terminals of a bridge rectifier 140 such as that manufactured by Varo, Model VH447. The output terminals of bridge rectifier supply a plus and minus 15 volt DC unregulated signal. Both plus and minus outputs of the bridge rectifier 140 are connected to the tie point 57 through 20,000 mf filter capacitors 142. The positive output of bridge rectifier 140 is also electrically connected to terminal I of a voltage regulator 144 such as that manufactured by Fairchild, Model UA78L12AC. The negative output of rectifier 140 is electrically connected to terminal II of a second voltage regulator 146 of the type manufactured by Fairchild, Model UA79L12AC. The operation of the voltage regulators are so well known to those skilled in the art that they will not be elaborated upon here. Terminal I and terminal II of voltage regulators 144 and 146, respectively, are electrically interconnected to the tie-point 57 through 0.33 mf compensation bypass capacitors 148 and 150, respectively. Terminals III and I of voltage regulators 144 and 146, respectively, are electrically connected to the tie-point 57. Terminal II of voltage regulator 144 is electrically connected to output terminal 148. Terminal II of voltage regulator 146 is electrically connected to output terminal 150. Terminal 148 is at a potential of approximately +12 VDC and terminal 150 is at a potential of approximately −12 VDC. Terminal II of both voltage regulators 144 and 146 are also electrically interconnected to the tie-point 57 through 0.1 mf filter capacitors 152.

EXAMPLE

To calibrate a 100 horsepower meter at a 30 degree phase angle and with 440 VAC line voltage, the dissipation of approximately 74,600 watts within a load would be necessitated.

$P = EI \cos \phi$ $74,600 \text{(watts)} = 440 \text{(volts)} \times I \text{(amps)} \times 0.866$ With such an arrangement, the load would draw 196 amperes. To simulate that load, i.e. to operate a 100 H.P. meter at full scale, the simulator generates 440 VAC at 0.04 amperes at the voltage signal output terminals and 196 amperes at 1.5 VAC at the current signal output terminals. The power actually dissipated by these two circuits is approximately 17.6 watts and 294 watts respectfully or a total of 311.6 watts.

Thus, to calibrate a 100 H.P. meter at full scale requires the dissipation of 74,600 watts if an actual load is used but only 311.6 watts with the load simulator.

It is to be understood that the invention has been described with reference to specific embodiments which provide the features and advantages as previously described, and that such specific embodiments are susceptible of modification as will be apparent to those skilled in the art. Accordingly, the foregoing description is not construed in a limiting sense.

The embodiments of the invention in which an exclusive property or privilege is claimed are defined as follows:

1. Apparatus for simulating large electrical loads in alternating current systems incorporating power meters of the type having separate voltage and current sensing inputs, said apparatus comprising:
    a controlled current source operative to generate a selectively variable output alternating current signal having a fixed phase angle;
    phase shift means connected to receive said current signal and to generate a reference signal having a phase angle which is selectively variable with respect to the phase angle of said current signal;
    a controlled voltage source connected to receive said phase reference signal and to generate a selectively variable output voltage signal;
    current signal connector means for interconnecting said controlled current source and the current sensing inputs of a power meter whereby said current sensing inputs receive said current signal;
    and voltage signal connector means for interconnecting said controlled voltage source and the voltage sensing inputs of said power meter whereby said voltage sensing inputs receive said voltage signal.

2. Apparatus as described in claim 1 further comprising phase angle display means operative to receive said current and voltage signals and to generate a sensible display of the phase angle differential thereof.

3. Apparatus as described in claim 1 further comprising voltage amplitude display means operative to receive said output voltage signal and to generate a sensible display thereof.

4. Apparatus as described in claim 1 further comprising current amplitude display means operative to receive said output current signal and to generate a sensible display thereof.

5. Apparatus for simulating large electrical loads in alternating current systems incorporating power meters of the type having separate voltage and current sensing inputs, said apparatus comprising:
    a controlled current source operative to generate a selectively variable output alternating current signal characterized by a relatively low voltage;
    a controlled voltage source connected to receive said current signal and to generate a selectively variable output voltage signal characterized by a relatively low current, said voltage signal being phase locked with said current signal;
    an AGC circuit interposed mediate said controlled current source and controlled voltage source;
    current signal connector means for interconnecting said controlled current source and the current sensing inputs of a power meter whereby said current sensing inputs receive said current signal;
    and voltage signal connector means for interconnecting said controlled voltage source and the voltage sensing inputs of said power meter whereby said voltage sensing inputs receive said voltage signal.

6. Apparatus as described in claim 5 further comprising phase angle display means operative to receive said current and voltage signals and to generate a sensible display of the phase angle differential thereof.

7. Apparatus as described in claim 5 further comprising voltage amplitude display means operative to receive said output voltage signal and to generate a sensible display thereof.

8. Apparatus as described in claim 5 further comprising current amplitude display means operative to receive said output current signal and to generate a sensible display thereof.

9. Apparatus for simulating large electrical loads in alternating current systems incorporating power meters of the type having separate voltage and current sensing inputs comprising:
    an autotransformer and current step-up transformer operative to generate a selectively variable output current signal characterized by a relatively low voltage;
    an AGC circuit operative to receive said output current signal and to generate a current reference signal;
    a phase shift circuit operative to receive said current reference signal and to generate a selectively variable phase reference signal which is phase displaced from said current reference signal;
    a power amplifier operative to receive said phase reference signal and to generate a selectively variable output voltage signal;
    current signal jumper cables for interconnecting said step-up transformer and the current sensing inputs of a power meter whereby said current sensing inputs receive said current signal;
    and voltage signal connector means for interconnecting said power amplifier and the voltage sensing inputs of said power meter whereby said voltage sensing inputs receive said voltage signal.

10. Apparatus as described in claim 9 further comprising a pre-amplifier circuit electrically interposed mediate said current step-up transformer and said AGC circuit.

11. Apparatus as described in claim 9 further comprising a phase amplifier circuit electrically interposed mediate said phase shift circuit and said power amplifier circuit.

12. Apparatus as described in claim 10 further comprising a driver circuit electrically interposed mediate said phase amplifier circuit and said power amplifier circuit.

13. Apparatus as described in claim 9 further comprising phase angle display means operative to receive said current and voltage signals and to generate a sensible display of the phase angle differential thereof.

14. Apparatus as described in claim 13 wherein said phase angle display means is a phase angle meter.

15. Apparatus as described in claim 9 further comprising voltage amplitude display means operative to receive said output voltage signal and to generate a sensible display thereof.

16. Apparatus as described in claim 15 wherein said voltage amplitude display means is an RMS voltmeter.

17. Apparatus as described in claim 9 further comprising current amplitude display means operative to receive said output current signal and to generate a sensible display thereof.

18. Apparatus as described in claim 17 wherein said current amplitude display means is an RMS voltmeter.

19. Apparatus as described in claim 17 wherein said current amplitude display means is an RMS ammeter.

* * * * *